United States Patent [19]

Bohannon et al.

[11] Patent Number: 5,146,869
[45] Date of Patent: Sep. 15, 1992

[54] TUBE AND INJECTOR FOR PREHEATING GASES IN A CHEMICAL VAPOR DEPOSITION REACTOR

[75] Inventors: Kenneth W. Bohannon; Kuppuswamy Srikrishna, both of Puyallup; Anthony F. Sholing, Spanaway; Steven E. Reder, Puyallup, all of Wash.

[73] Assignee: National Semiconductor Corporation, Santa Clara, Calif.

[21] Appl. No.: 535,811

[22] Filed: Jun. 11, 1990

[51] Int. Cl.⁵ ............................................. C23C 16/00
[52] U.S. Cl. .................................. 118/724; 118/715; 118/725; 156/345
[58] Field of Search ...................... 118/715, 725, 724; 156/345

[56] References Cited

U.S. PATENT DOCUMENTS

| | | | |
|---|---|---|---|
| 4,232,063 | 11/1990 | Rosler et al. | 427/255.3 |
| 4,579,080 | 4/1986 | Martin et al. | 118/725 |
| 4,632,058 | 12/1986 | Dixon et al. | 118/725 |
| 4,957,781 | 9/1990 | Kanegae | 118/725 |

OTHER PUBLICATIONS

Silicon Valley Group Brochure "SVG Vertical Thermal Reactor".

Primary Examiner—Richard Bueker
Attorney, Agent, or Firm—Townsend and Townsend

[57] ABSTRACT

A gas injector apparatus and process, having a gas injector tube ending at the top of a vertical reaction chamber, improves the thickness and resistivity uniformity of films deposited in CVD process reactors. The injection tube has a plurality of baffles to increase the residence time of reactant gases flowing toward the reaction chamber.

11 Claims, 6 Drawing Sheets

TUBE AND INJECTOR FOR PREHEATING GASES IN A CHEMICAL VAPOR DEPOSITION REACTOR

BACKGROUND OF THE INVENTION

This invention pertains generally to vapor deposition of films on substrates and more particularly to a reactant gas injector apparatus and process of improving uniformity of thickness and resistivity of deposited films in chemical vapor deposition reactors.

Heretofore, silicon compounds have been deposited on semiconductor wafers and other substrates in high temperature oxide (HTO) reactors which commonly include an elongated tube defining a reaction chamber and a heating source surrounding the tube for heating wafers in the chamber. Reactant gases flow through the chamber or plenum in an axial direction, and the wafers are positioned with their major surfaces perpendicular to the direction of gas flow.

Increased sophistication and density of integrated circuit devices demands tight uniformity specifications which chemical vapor deposition (CVD) process equipment must satisfy. As the diameter of semiconductor wafers has increased and the requirement for processing more wafers per batch has accelerated, it has become increasingly difficult to maintain sufficient control over uniformity of film thickness. For example, if between 75 and 100 four-inch wafers per batch are being processed, it is not only difficult to maintain uniformity of film thickness across the area of each wafer but also from wafer to wafer in each batch.

Reactors have been modified in the past to improve uniformity of film thickness across individual wafers and across the wafer boat. For example, a perforated distribution tube positioned within a horizontal reaction tube has been used to redirect gas flow patterns.

Vertical reactors possess certain advantages over their horizontal counterparts. Gases are exhausted only from the bottom, and those gases inside the tube can only be pushed out by gases entering from the top. As a result, nearly perfect plug flow can be achieved. A vertical configuration also provides for precision and reproducibility in both the horizontal and radial placement of the carrier within the tube. In some vertical reactors, some reactant gas preheating and premixing occurs. However, improved uniformity in film thickness is achieved through, for example, changing the susceptor thickness, which permits control of induced heating at prearranged susceptor locations, altering the temperature distribution within the susceptor and wafers; reducing the thickness of susceptor supports for greater heating at the edges of susceptors which are susceptible to greater heat loss; and boundary control arrangements which alter gas flows, so that all reactant gases are not deposited on the first wafers to contact the gases. All of these mechanical changes require substantial equipment modification.

Variations in the vertical design to improve uniformity of film thickness have been tried, with limited success. For example, some improvement in film thickness uniformity is achieved by adjusting the height-to-diameter ratio of the bell jar along with controlling susceptor temperature. However, attempts to alter the temperature of susceptors, increases film thickness uniformity at the expense of film resistivity uniformity.

Vertical reactors produced by Silicon Valley Group, Inc., San Jose, Calif., are another variation in the vertical reactor design. In one version, as shown in FIG. 1, the vertical furnace 3 has heating means 5, a reactant gas inlet 6, which connects gas sources 8 via a manifold 9 to reaction chamber or plenum 13. Reactant gases pass across a boat 15 of wafers 18 on which a film is to be deposited. As in typical vertical reactors, boat 15 is enclosed within reactor tube 27, having thermowell 21, exhaust 24, and a quartz pedestal 28 on which boat 15 sits. Process tube door 29 allows access to the reactor, and the whole apparatus sits on base plate 30. The film is conventionally deposited by the injection of two or more reactant gases such as nitrous oxide ($N_2O$) and dichlorosilane ($Si_2H_2Cl_2$) into the lower pressure (roughly 450 millitorrs) reaction chamber 13. The rate of reaction and hence the deposition rate is a function of the process temperature, process pressure and gas flow rates. The film thickness uniformity across a wafer and across the load is a function of inter-wafer spacing, the process pressure, and the range or skew of temperatures used in the reactor.

SUMMARY OF THE INVENTION

In the reactant gas injector apparatus and process of the present invention, the reactant gas path length, and therefore the residence time, is increased by providing an injector tube positioned to preheat reactant gases to substantially near the reactor temperature. The reactant gases are preheated and premixed without changing the dimensions (wafer-to-wafer spacing) of the reactor nor compromising advantages of a vertical reactor for depositing films. The apparatus of the present invention comprises an injector tube having its distal end disposed near the top of the vertical reactor plenum. This preheating leads to increased uniformity of film thickness wafer-to-wafer and across the boat compared with processing the same amount of wafers per load using the reactor without the injector tube. Surprisingly, these advantages are maintained when the process load is increased by up to 33%, i.e., more wafers meet film uniformity specifications. The injector tube and process allows film deposition to occur at low temperature skews across the reactor boat thereby reducing the disparity in thermal histories of the wafers in a given load.

A process for depositing films of relatively uniform thickness on a plurality of generally planar wafers is also described herein. The process comprises introducing a plurality of reactant gases into an injector tube, preheating the reactant gases to substantially near the reactor plenum temperature while said gases flow through the injector tube, and depositing the film on the generally planar wafers while the reactor plenum temperature ranges from about 885° C. to about 905° C. in various locations of the reactor plenum. The film thickness uniformity is increased but not at the expense of resistivity uniformity in this method, contrary to prior art methods. This is because although the reactant gases are preheated to substantially near the reactor plenum temperature, the reactor plenum temperature itself is lower than in the standard reactor. The lower reactor temperature favors electrical properties in the finished wafers such as threshold voltage (the "turn-on" voltage for an MOS transistor from such a wafer) and the resistivity of the wafers.

Additional features of the invention will be apparent from the following description in which the preferred embodiments are set forth in conjunction with the accompanying drawings.

DESCRIPTION OF THE PREFERRED EMBODIMENTS

In equipment such as the reactor described above supplied by Silicon Valley Group, Inc., problems with processing more than 75 wafers per run have been noted. From a productivity standpoint, it is necessary to develop a process for a 100 wafer load. It was determined that the problem in vertical reactors is associated with inadequate heating of the reactant gases before they contact the wafers. In most vertical reactor designs, the reactant gases reach the first wafers to be processed within the first two inches of entering the tube, not permitting the gases to reach the reaction temperature until approximately one-third of the distance down the boat. This shortcoming prevents a full-production load of 100 wafers from being processed. Moreover, previous reactor designs required process temperatures to be in the range of about 900° C. to about 950° C. across the load.

Figure 1:
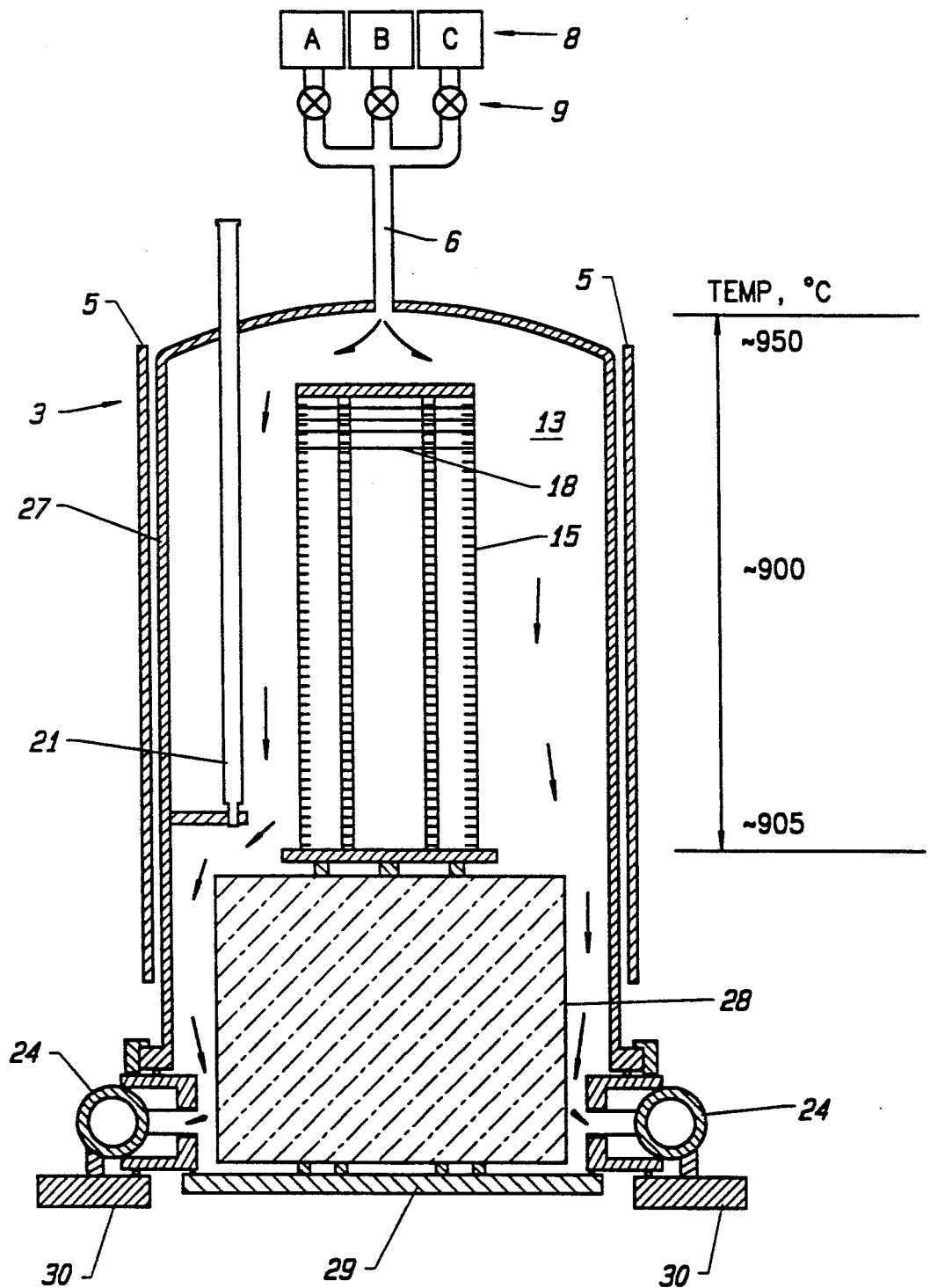
FIG. 1 is a schematic diagram of a vertical HTO CVD reactor, having a system in accordance with the prior art.
Figure 2:
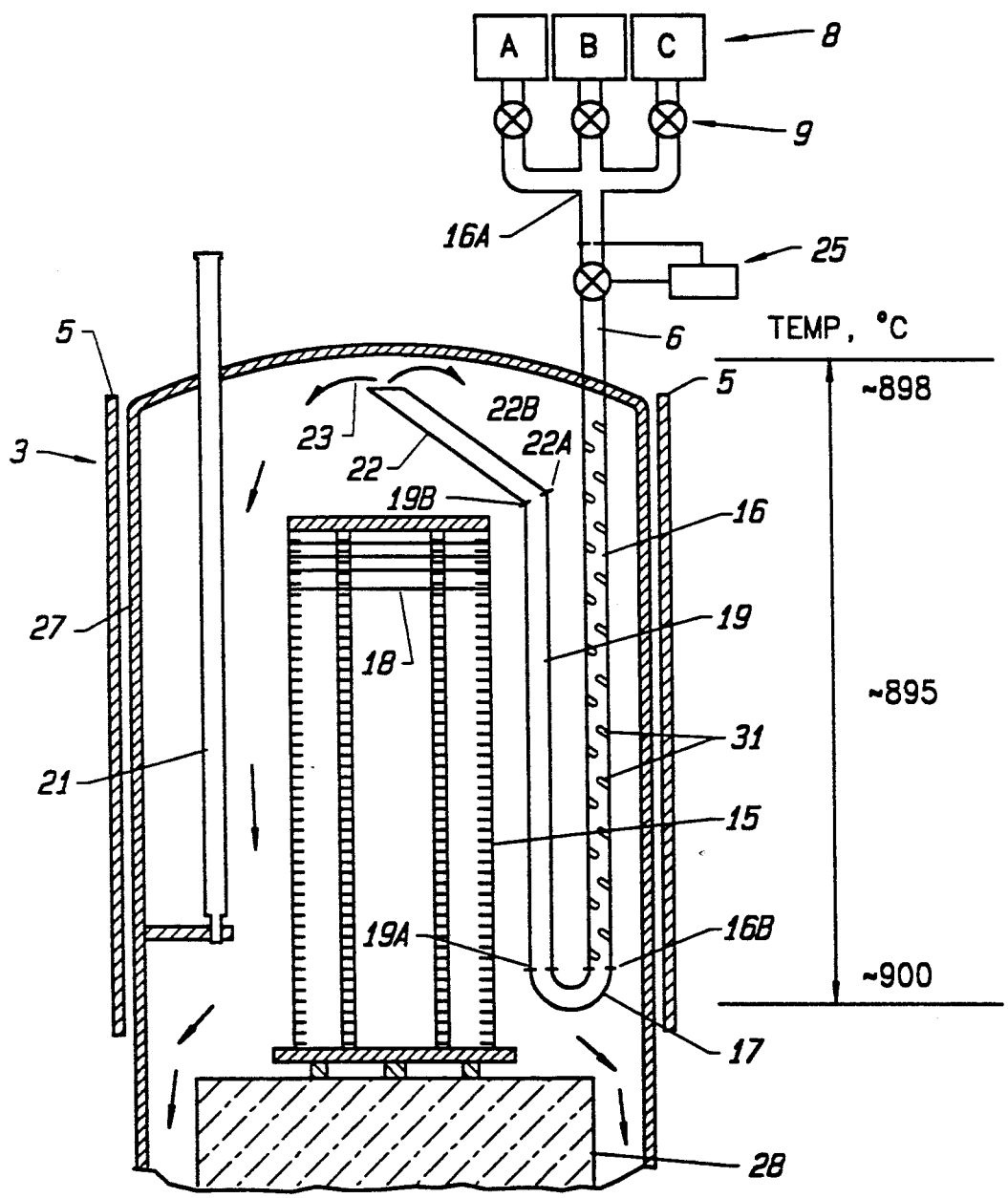
FIG. 2 is a schematic diagram of the same HTO CVD reactor of FIG. 1, having a reactant gas injector tube in accordance with the present invention.
Figure 3:
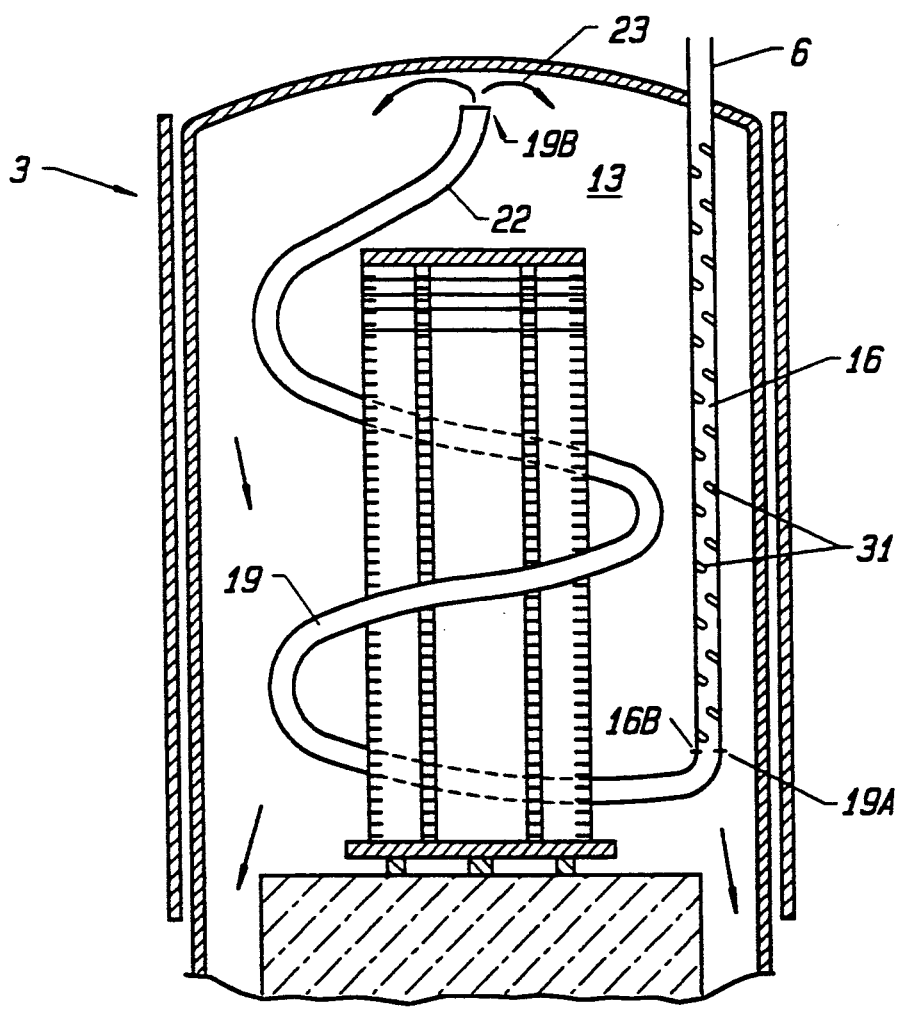
FIG. 3 is another schematic diagram of an HTO CVD reactor, having an injector tube in accordance with the present invention.

FIGS. 2 and 3 show vertical reactors having injector tubes according to the present invention. Vertical furnace 3 has heating means 5, injector tube 6 which connects gas sources 8 with reaction chamber 13, boat 15 holding wafers 18 to be processed, and a thermowell 21. The exhaust outlet and support structure are the same as in FIG. 1 and are not shown. Reactor tube 27 encloses reaction chamber 13, injector tube 6, boat 15, and thermowell 21. The reactor tube, heating means, thermowell, boat, and pedestal are conventional components used in the art. The reactor tube is usually quartz, as are the pedestal and boat. The heating means can be any means known in the art.

FIG. 2 further discloses one preferred embodiment having first injector tube section 16, second injector tube section 19, and third injector tube section 22. Reactant gases flow from gas sources 8, through gas manifold 9 and flow controller 25, then through first section 16, shown here as the only section having a plurality of baffles 31. After the gases are preheated to substantially near the reactor plenum temperature and mixed in first injector tube section 16, the preheated and mixed gases flow toward the top and center of the reaction plenum or chamber 13, passing through elbow 17, second injector tube section 19, and third injector tube section 22. Reactant gases emerge at or near the top center of reaction chamber 13 as shown at 23 at substantially near the reactor temperature. As used herein, the term "substantially near the reactor temperature" is intended to mean that the reactant gases are preheated to a temperature that approaches the reactor temperature to within at least about 200° C., preferably to within at least about 100° C. First injector tube section 16 is connected at its proximal end 16A to gas manifold 9, and at its distal end 16B to elbow 17, where elbow 17 connects further with proximal end 19A of second injector tube section 19. Distal end 19B of second injector tube section 19 connects with proximal end 22A of the third injector tube section 22. It can be seen that the specific embodiment of injector tube 6 can continue to many individual sections, all connected as described. However, the distal end of the final injector tube section, here shown as 22B, is preferably positioned in all embodiments near the top, center of reaction chamber 13.

FIG. 3 shows another embodiment of the injector tube of the present invention. Only the essential details are shown. This embodiment comprises only two sections, a substantially straight, vertical section 16 having baffles 31, and a helical second section 19, having its proximal end 19A at the distal end 16B of straight section 16, and its distal end 19B at or near the top of reaction chamber 13. Spent reaction gases leave the reaction chamber 13 through an exhaust outlet, not shown.

While both FIGS. 2 and 3 show the injector tube having baffles only in first injector section 16, baffles may be positioned in part or all of the injector tube 6. All that is required is that means to increase the residence time of the reactant gases be provided such that the gases approach or come substantially near the reaction chamber temperature before injection into the reaction chamber. This may be accomplished by adjusting the parameters shown in FIGS. 4-6.

Figure 4:
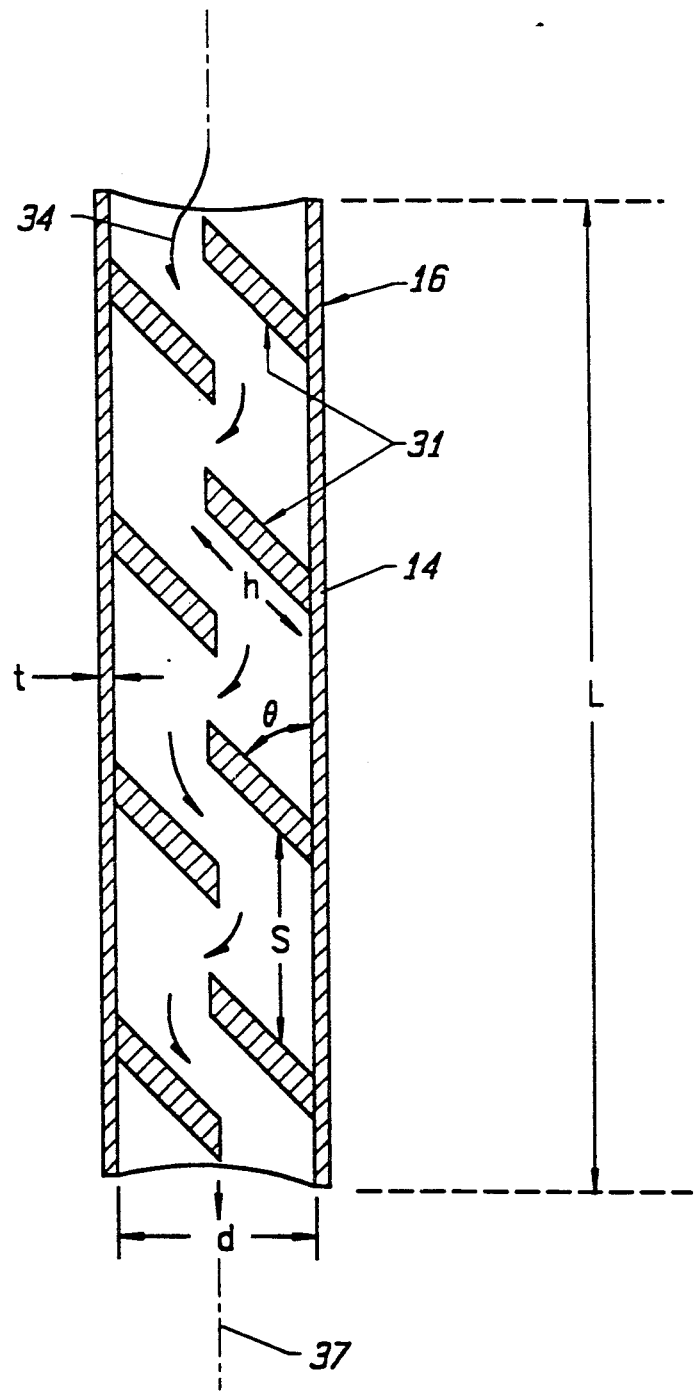
FIGS. 4-6 are vertical sectioned views showing the major features of injector tubes in accordance with the present invention.
Figure 5:
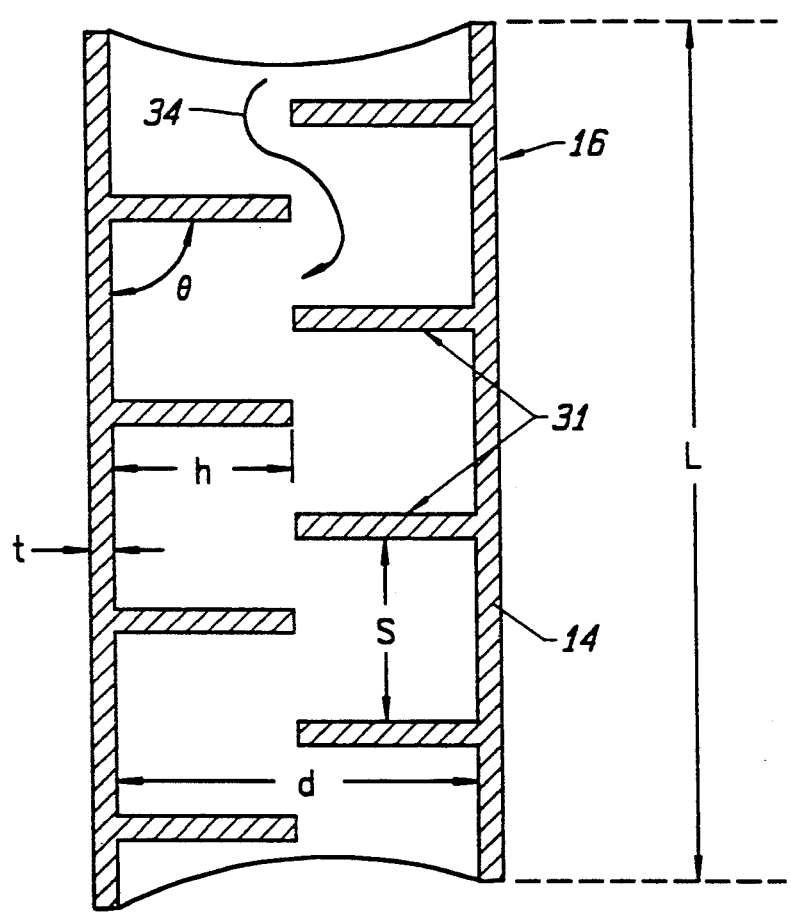
Figure 6:
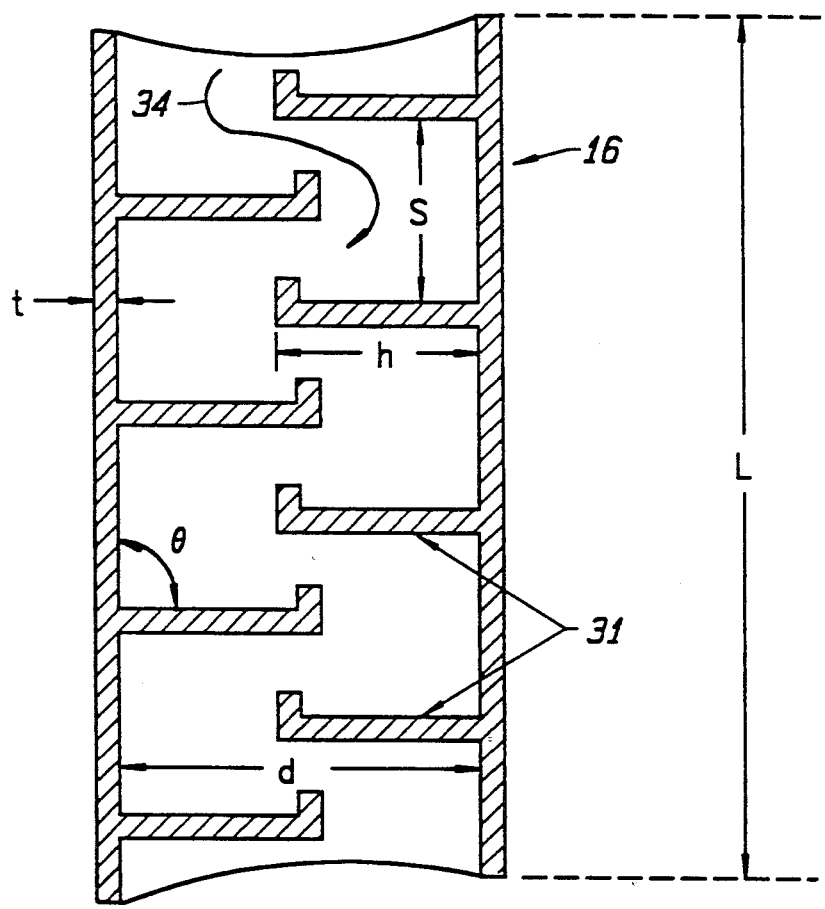

FIGS. 4-6 show three configurations of baffles that may be used to increase the path length/residence time of the reactant gases, and thus preheat and premix the gases. In FIGS. 4-6, first injector tube section 16 is shown in cross section, showing the reactor tube wall 14, tube wall thickness t, baffle pitch $\theta$, tube internal diameter d, baffle spacing s, and baffle length h. The path of reactant gases is shown as 34. The residence time is increased over that of a tube without the baffles, preferably at least by 10%. Also shown is injector tube length 1. The injector tube will preferably extend a substantial internal length of the vertical reactor, i.e., in position to preheat the inlet reactant gases to approach the reaction chamber temperature before injection into the reaction chamber. The length-to-diameter ratio (1/d) and other parameters mentioned above, may be varied by the user of the injector tube, and those skilled in the art can easily arrive at the desired gas residence time for the amount of wafers to be processed in each particular application. Preferably the injector tube has an 1/d ranging from about 50:1 to about 500:1, and a tube wall thickness ranging from about 0.25 inch to about 0.50 inch. The baffle spacing usually ranges from about 0.25 inch to about 1.0 inch, and the baffle pitch ranges from about 30° to about 90°.

The injector tube and baffles may be made of the same or different materials. Generally, any materials that will be inert to the process and that will be able to withstand the process conditions of temperature and pressure will be adequate. The material must withstand a maximum temperature of about 950° C. and pressures ranging from about 300 to about 600 millitorrs. Preferred materials are stainless steel and quartz, although other materials with similar properties may be used.

Returning to FIGS. 1 and 2, note that the temperature variation or "skew" across the reaction chamber 13 and boat 15 are different. In the prior art design (FIG. 1) the skew is roughly 50° C., while the skew using the novel injector tube of the present invention is only roughly 10° C. This change is critical, in that wafers located at the top of the boat receive approximately the same temperature conditions as those of the middle and bottom of the boat. The temperatures reflected in FIG. 1 show that the temperature at the top third of the boat must be roughly 50° C. higher than the remainder of the boat in order to improve across-load uniformity of film thickness. If a full load of 100 wafers is used in the prior art design, the reacting gases do not heat-up to the reaction temperature of roughly 900° C. until approximately one-third of the distance down the length of the boat.

Although the invention may be utilized in a wide variety of film depositions, it is particularly suitable for depositing HTO $SiO_2$ on doped or undoped silicon wafers in the following reaction:

$$2N_2O + SiCl_2H_2 \rightarrow SiO_2 + 2N_2 + 2HCl \text{ (850° to 900° C.)}$$

Particularly preferable reaction plenum temperature ranges from about 890° C. to about 900° C., and at a pressure ranging from about 400 millitorrs to about 460 millitorrs, although temperatures at least above 800° C. and pressures of at most 600 millitorrs are generally preferred.

The invention may also be used to deposit silicon nitride ($Si_3N_4$) by replacing $N_2O$ with $NH_3$ in the above reaction. This reaction occurs at temperatures ranging from about 750° C. to about 800° C., and at approximately the same pressures as the $SiO_2$ process.

The following examples serve to illustrate the advantages of the invention. Example 1 pertains to the deposition of $SiO_2$ on silicon wafers using the reactor shown in FIG. 1., and Example 2 pertains to the same reaction utilizing the injector tube of the present invention in the reactor of FIG. 2.

EXAMPLE 1

Vertical Reactor with without Injector Conditions

| Reactor Pressure, millitorrs = | 420 |
| Deposition Rate, Ang/min = | 47 |
| Reactor Temperature,[1] °C. = | 950/900/905 |
| Ratio $N_2O/SiCl_2H_2$ = | 1.5 |
| Load, wafers = | 75 |

| | Uniformity of Thickness (±%)[2] | |
| Run | Load | Wafer |
| --- | --- | --- |
| 1 | 4.0 | 2.0/3.3/2.4 |
| 2 | 4.0 | 2.3/3.2/2.3 |
| 3 | 5.0 | 2.2/3.3/2.5 |
| 4 | 4.2 | 2.9/3.3/2.5 |
| 5 | 4.4 | 1.3/3.2/2.6 |
| 6 | 1.8 | 2.1/3.1/2.4 |
| 7 | — | —/2.4/— |
| 8 | — | —/2.8/— |
| 9 | — | —/2.2/— |
| 10 | — | —/2.7/— |
| 11 | — | —/2.3/— |
| AVG. | 3.9 | 2.1/2.9/2.5 |
| STANDARD DEVIATION | 1.09 | 0.51/0.43/0.10 |

[1]Three temperatures represent top, middle, bottom of load.
[2]Wafer uniformity measured at respective temperatures.

EXAMPLE 2

Vertical Reactor with Injector Tube Conditions

| Reactor Pressure, millitorrs = | 450 |
| Deposition Rate, Ang/min = | 42 |
| Reactor Temperature,[1] °C. = | 898/895/900 |
| Ratio $N_2O/SiCl_2H_2$ = | 1.5 |
| Load, wafers = | 100 |

| | Uniformity of Thickness (±%)[2] | |
| Run | Load | Wafer |
| --- | --- | --- |
| 1 | 2.2 | 2.2/2.0/2.0 |
| 2 | 2.3 | 3.0/2.4/2.4 |
| 3 | 2.3 | 2.6/1.9/1.9 |
| 4 | 1.7 | 2.4/2.3/2.3 |
| 5 | 2.2 | 2.3/2.4/2.4 |
| 6 | 1.7 | 2.7/2.6/2.6 |
| 7 | — | —/2.5/— |
| 8 | — | —/2.6/— |
| 9 | — | —/2.6/— |
| 10 | — | —/2.8/— |
| 11 | — | —/3.3/— |
| AVG. | 2.0 | 2.5/2.5/2.3 |
| STANDARD DEVIATION | 0.28 | 0.29/0.38/0.27 |

[1]Three temperatures represent top, middle, bottom of load.
[2]Wafer uniformity measured at respective temperatures.

Two main factors are to be noted in the data. The data for Example 1 is for a 75 wafer load while the data for Example 2 is for a 100 wafer load. When 100 wafer loads are tried in the prior art design, as stated above, the across-the-load uniformity suffers dramatically (rising ±10 to 15%) since the reactant gases must pass roughly one-third of the length of the boat to reach the reaction temperature. Secondly, note that the wafers in each run of Example 2 receive approximately the same temperature cycling, which is extremely important when using the wafers in finished integrated circuits. Although uniformity in thickness is higher at 950° C. in Example 1, resistivity and threshold voltage suffer at these high temperatures, as is well known in the art. Comparing data at about 900° C., note the increase in thickness uniformity of the inventive design over the standard design.

While the present invention has been discussed with respect to $SiO_2$ deposition, it can also be applied to other chemical vapor deposition processes as well, such as for example, epitaxial silicon deposition, silicon nitride, thin (less than 1 micron thick) and thick (approximately 500 microns) polycrystalline silicon.

The present invention is useful for any deposition process which is performed at higher temperatures where the uniformity of any layer is controlled by the specific combination of the gas flow rate, the specific geometry the reactor enclosure, including the shape and location of the gas inlet, and the temperature uniformity of the reactor plenum. The apparatus and process herein described can also be used to control the average resistivity of finished wafers since resistivity uniformity is primarily controlled by local temperature values. The variation in resistivities when using the invention herein will be much less than the prior art reactor designs, since local temperatures are roughly the same.

Thus, while the invention has been particularly shown and described with reference to the preferred embodiments, it is understood by those skilled in the art that changes in form and details may be made therein without departing from the spirit of this invention. It is therefore intended that an exclusive right be granted to the invention as claimed only by metes and bounds of independent claims.

What is claimed is:

1. An apparatus allowing preheating of reactant gases in a vertical CVD reactor, the reactor having a heated chamber, said apparatus comprising an injector tube for preheating said reactant gases to substantially near the reactor temperature, wherein said injector tube has its distal end disposed near the top of said chamber and has a length within said chamber substantially greater than the length of the longest dimension of said chamber plus the horizontal distance from a sidewall of said chamber to said distal end.

2. An apparatus in accordance with claim 1 having said vertical reactor adapted to cooperate at a temperature of at least 800° C. and a pressure of at most 600 millitorrs.

3. An apparatus in accordance with claim 1, said injector tube having means to increase the residence time of said reactant gases in said injector tube relative to the residence time of said reactant gases in an injector tube of equal shape and dimensions with smooth interior walls.

4. An apparatus in accordance with claim 3, said means to increase the residence time of said reactant gases comprising a plurality of baffles extending radially from the inside wall of said injector tube.

5. An apparatus for depositing films of relatively uniform thickness on a plurality of generally planar wafers comprising:
  A. a reactor tube having a reaction chamber;
  B. an injector tube for injecting reactant gases into said reaction chamber, said injector tube having a length within the reactor chamber substantially greater than the length of the longest dimension of said chamber plus the horizontal distance from a sidewall of said chamber to said distal end;
  C. a boat for holding wafers in a generally horizontal plane;
  D. means for heating said boat and said wafers; and
  E. an exhaust outlet to remove spent reactant gases.

6. An apparatus according to claim 5, said reactant gas injector tube having means to increase the residence time of said gases within said injector tube as they pass from reactant gas vessels to said chamber, the increase in residence time being relative to the resident time of said gases in an injector tube of equal shape and dimensions with smooth interior walls, said injector tube having its distal end positioned near the top of said reaction chamber.

7. An apparatus in accordance with claim 6 wherein said means to increase the residence time of said gases comprises baffles extending radially from the inner wall of said injector tube, said baffles having a baffle spacing and baffle pitch designed to increase the residence time of reactant gases in said tube by at least 10% over the residence time without said baffles.

8. An apparatus according to claim 7, said tube having a length-to-diameter ratio ranging from about 50:1 to about 500:1, and having wall thickness ranging from about 0.25 inch to about 0.5 inch.

9. An apparatus according to claim 7, having a baffle spacing ranging from about 0.25 inch to about 1.0 inches, and having a baffle pitch ranging from 30° C. to about 90° C.

10. An apparatus according to claim 5, said injector tube consisting of a straight section and a coiled section, said straight section extending from the top of said reactor to substantially the bottom of said reactor, and said coiled section beginning at the distal end of said straight section and coiling upwards and around a boat holding wafers, said coiled section having a distal end near the top of said reaction chamber.

11. An apparatus according to claim 10, said injector tube having its distal end terminating near the top of said reaction chamber.

* * * * *